(12) United States Patent
Bergmiller

(10) Patent No.: US 6,318,798 B1
(45) Date of Patent: Nov. 20, 2001

(54) SOLAR COVER FOR A ROOF OPENING IN A MOTOR VEHICLE AND PROCESS FOR ITS PRODUCTION

(75) Inventor: Alexander Bergmiller, Augsburg (DE)

(73) Assignee: Webasto Vehicle Systems International GmbH, Stockdorf (DE)

( * ) Notice: Subject to any disclaimer, the term of this patent is extended or adjusted under 35 U.S.C. 154(b) by 0 days.

(21) Appl. No.: 09/526,526

(22) Filed: Mar. 16, 2000

(30) Foreign Application Priority Data

Mar. 17, 1999 (DE) ................................................ 199 11 811

(51) Int. Cl.[7] ........................................................ B60J 7/04
(52) U.S. Cl. ........................................ 296/211; 296/216.09
(58) Field of Search .................................... 296/211, 215, 296/216.06, 216.09; 136/241

(56) References Cited

FOREIGN PATENT DOCUMENTS

| 41 05 396 | 9/1992 | (DE) . | |
|---|---|---|---|
| 32521 | * 2/1984 | (JP) | ...................................... 296/211 |
| 404306126 | * 10/1992 | (JP) | ...................................... 296/211 |

* cited by examiner

Primary Examiner—Dennis H. Pedder
(74) Attorney, Agent, or Firm—Nixon Peabody LLP; David S. Safran

(57) ABSTRACT

A solar cover for a roof opening in a motor vehicle roof, having a transparent cover panel (12) with a solar cell combination (14) which is located on its underside and which is formed of solar cells (20) which are embedded in an elastic film composite (16, 18, 22), and a carrier element (26) which is attached to the underside of the cover panel by means of a peripheral foaming (28) on the outside edge of the cover panel and the carrier element. The peripheral foam (28) is also sealed toward the inside by an emergence area (24) which is formed of the elastic film composite extending outwardly from the solar cells (20) by being clamped to form a seal between the carrier element (26) and the cover pane (12). A process for producing such a solar cover involves selecting a vertical distance between the cover panel and the carrier element such that the emergence area is clamped to form a seal between the carrier element and the cover panel inwardly of the peripheral foaming.

12 Claims, 1 Drawing Sheet

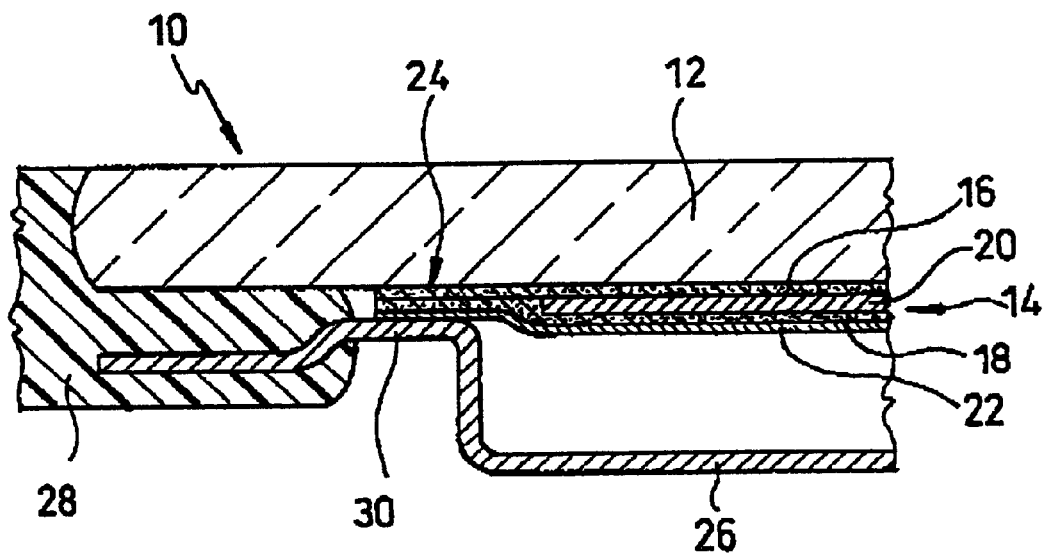

ature of the invention

SOLAR COVER FOR A ROOF OPENING IN A MOTOR VEHICLE AND PROCESS FOR ITS PRODUCTION

BACKGROUND OF THE INVENTION

1. Field of the Invention

This invention relates to a solar cover for a motor vehicle roof with a transparent cover panel with a solar cell combination which is located on its underside and which comprises solar cells which are embedded in an elastic film composite and a carrier element which is attached by means of peripheral foaming to the outside edge of the cover panel and of the carrier element. The invention also relates to a process for production of Such a solar cover.

2. Description of Related Art

Published German Patent Application DE 41 05 396 A1 discloses a generic solar cover in which an elastic film composite is formed by two transparent adhesive films, between which the solar cells and conductor paths for electrical connection of the solar cells are embedded. The adhesive films and the solar cells and conductor paths which are embedded in them, in turn, are enclosed between a pane of glass which forms the cover panel and a carrier layer which is formed by a sheet of metal. The carrier element is formed by an inside cover sheet which is made as a profile having elevated areas which adjoin the carrier sheet of the solar cell combination. The solar cell combination extends flush with the glass pane as far as its edge. Directly on the edge of the carrier sheet of the solar cell combination, the inside cover sheet does not adjoin the carrier sheet, a peripheral foaming extending into this area. An operating part of a displacement mechanism for the solar cover is attached to the bottom of the inside cover sheet. The solar cover can be used for sliding roofs, sliding and lifting roofs, spoiler roofs and the like.

The disadvantage in this known solar cover is that the peripheral foaming to the inside is not always well sealed because two sheets lie on top of one another on the inner end of the peripheral foaming. Improved sealing can only be achieved by means of an additional element, for example, a sealing strip or bead of adhesive. However, this would make production more complex, resulting in additional costs due to increased production time and an additional component as well as an additional tool for applying the sealing medium or component.

SUMMARY OF THE INVENTION

The primary objects of this invention are to devise a solar cover which is seal better as much as possible without added costs, and to provide a process for production of such a solar cover.

These objects are achieved with respect to the solar cover by the peripheral foam being sealed to the inside by an emergence area of the elastic film composite which extends outwardly over the solar cells and is clamped to form a seal between the carrier element and the cover panel, and as for the process for producing such a solar cover by a vertical distance being set between the cover panel and the carrier element such that the emergence area is clamped to form a seal between the carrier element and the cover pane inwardly of the peripheral foaming.

In this approach according to the invention, it is advantageous that the emergence area of the elastic film composite acts as a sealing element between the carrier element and the cover panel, by which the peripheral foaming is sealed toward the inside, without an additional component having to be used which would raise production costs.

In an advantageous embodiment of the invention, it is provided that the carrier element is provided with a sealing bead which presses on the emergence area of the film composite. In this way, the sealing action can be improved.

Preferably, the emergence area of the film composite ends in front/inwardly of the edge of the cover panel and the carrier element; then, preferably, the peripheral foaming in the edge area extends into the area between the cover pane and the carrier element, preferably as far as the outer end of the emergence area of the film composite. This guarantees a connection between the cover pane and the carrier element which is as secure as possible.

For protective purposes and/or for aesthetic reasons, the lowermost layer of the film composite is formed preferably by an elastic cover film. Furthermore, the film composite preferably comprises two elastic adhesive films between which the solar cells are embedded.

The carrier element is preferably made in one piece and extends essentially over the entire peripheral edge area of the cover panel. The cover panel is preferably made of a glass pane, while the carrier element is preferably formed of a sheet metal profile.

The solar cover is intended especially for a sliding roof, a lifting roof, a sliding and lifting roof or a spoiler roof.

These and further objects, features and advantages of the present invention will become apparent from the following description when taken in connection with the accompanying drawings which, for purposes of illustration only, show a single embodiment in accordance with the present invention.

BRIEF DESCRIPTION OF THE DRAWINGS

The sole FIGURE of the drawings is a cross-sectional view of a portion of a solar cover in accordance with a preferred embodiment in an edge area thereof.

DETAILED DESCRIPTION OF THE INVENTION

The solar cover 10 which is shown in the single figure comprises a cover panel which is made preferably of a transparent glass pane 12, with a solar cell combination 14 cemented to its underside by an adhesive film 16. Between the adhesive film 16 and another adhesive film 18 several solar cells 20 are embedded. The adhesive films 16 and 18 are transparent and elastic. On the bottom of the lower adhesive film 18, an elastic cover film 22 is cemented to protect the solar cell combination 14. For aesthetic reasons, the cover film can be opaque.

The two adhesive films 16 and 18 and the cover film 22, together, form an elastic film composite which has an emergence area 24 which extends outwardly from the solar cells 20. In the peripheral and outside edge area of the cover panel 12, there is a one-piece, or alternatively a multi-piece, carrier element 26 underneath the cover panel 12 which is used to join the cover 10, for example, to the operating parts of a cover displacement mechanism. The carrier element 26 (the so-called inner cover sheet) is made as a preferably one-piece sheet metal profile and extends essentially over the entire peripheral edge area of the cover panel 12. The carrier element 26 is peripherally surrounded, jointly with the glass pane 12, on the outside edge with a foam 28 which can be, for example, polyurethane (PU). The carrier element 26 and the cover panel 12 are located at a vertical distance relative to one another, the peripheral foam 28, in the edge area, also extends into the area between the cover pane 12 and the carrier element 26. The carrier element 26 is formed with a raised peripheral sealing bead 30 which presses on the emergence area 24 of the film composite. The peripheral foam 28 extends in the intermediate space between the cover panel 12 and the carrier element 24 from the edge area, i.e., from the outside as far as the outer end of the emergence area 24 of the film composite. The vertical distance between the carrier element 26 and the cover pane 12 is selected such that the emergence area 24 of the film composite is clamped to form a seal between the sealing bead 30 of the carrier element 26 and the bottom side of the cover panel 12, i.e., is squeezed, to seal the peripheral foam 28 relative to the inside. The edges of the cover panel 12 and the carrier element 26 are essentially flush.

The elasticity of the emergence area 24 of the film composite, on the one hand, provides for a sealing action between the cover panel 12 and the carrier element 26, and on the other hand, is used to accommodate or compensate for tolerances both of the carrier element 26 and also of the cover panel 12, so that the sealing action is fully maintained within certain ranges of fluctuation. In this way, the corresponding parts need not be produced with excess precision, which can reduce the amount of scrap; this cuts production costs. Furthermore, the elastic emergence area 24 of the film composite ensures that the carrier element is not pressed with overly high pressure against the cover panel 12.

The production of the solar cover takes place as follows:

First, the solar cell combination 14 is attached by means of the top adhesive film 16 to the cover panel 12 on its bottom side. Then, the carrier element 26 is placed on the underside of the cover panel 12 or of the solar cell combination 14, with the sealing bead 30 of the carrier element 26 coming to rest on the elastic emergence area 24 of the solar cell combination 14. In doing so, the cover panel 12 and the carrier element 26 are located in a corresponding foaming tool in which, now, the edge areas of the cover panel 12 and of the carrier element 26 are peripherally foamed. The vertical distance between the cover panel 12 and the carrier element 26 is chosen such that the emergence area 24 of the solar cell combination 14 is clamped to form a seal between the sealing bead 30 of the carrier element 26 and the cover panel 12 in order to inwardly seal the peripheral foam 28 which has formed. In the forming tool, preferably a position of the carrier element 26 is chosen which inverted relative to its position of use, i.e., the solar cell combination is cemented on the bottom of the cover panel, i.e., the bottom which then lies facing upward, by means of the adhesive film 6 and then the carrier element 26 is placed from above with the sealing bead 30 on the emergence area 24.

In the above description and the claims "outside" or "outward" is defined as the direction which runs from the middle of the cover pane 12 toward its peripheral edge (in the figure, to the left), while "inside" or "inward" designates the direction which points from the peripheral edge of the cover panel 12 to its center (in the figure, to the right).

I claim:

1. Solar cover for a roof opening in a motor vehicle roof, comprising a transparent cover panel with a solar cell combination located on an underside thereof, the solar cell combination having solar cells which are embedded in an elastic film composite having an emergence area extending outwardly of the solar cells, and a carrier element attached by means of peripheral foam to an outside edge of the cover panel and an outside edge of the carrier element; wherein the peripheral foam is sealed toward inside by the emergence area of the elastic film composite which is clamped between the carrier element and the cover panel such that the carrier element compresses the emergence area against the transparent cover panel to from a seal.

2. Solar cover as claimed in claim 1, wherein the carrier element is provided with a sealing bead which engages the emergence area of the film composite.

3. Solar cover as claimed in claim 1 wherein the emergence area of the film composite ends inward of the outside edge of the cover panel and the carrier element.

4. Solar cover as claimed in claim 3, wherein the peripheral foam extends into an edge area between the cover panel and the carrier element.

5. Solar cover as claimed in claim 4, wherein the peripheral foam extends inward adjacent to an outer end of the emergence area of the film composite.

6. Solar cover as claimed in claim 1, wherein a lowermost layer of the film composite is formed of an elastic cover film.

7. Solar cover as claimed in claim 1, wherein the film composite has two elastic adhesive films between which the solar cells are embedded.

8. Solar cover as claimed claim 1, wherein the carrier element is a one-piece member and extends essentially over the entire peripheral edge area of the cover panel.

9. Solar cover as claimed in claim 1, wherein the cover panel is a glass pane.

10. Solar cover as claimed in claim 1, wherein the carrier element is made of a sheet metal profile.

11. Solar cover as claimed in claim 1, wherein the solar cover is a cover for one of a sliding roof, a lifting roof, a sliding and lifting roof, and a spoiler roof.

12. Process for producing a solar cover for a roof opening in a motor vehicle roof comprising the steps of:

a) attaching a solar cell combination, which comprises solar cells which are embedded in an elastic film combination, to an underside of a transparent cover panel with an emergence area of the elastic film composite extending outwardly from the solar cells;

b) placing a carrier element on a bottom side of the cover panel with the carrier element at least partially covering the emergence area and compressing the emergence area between the carrier element and the bottom side of the cover panel; and c) attaching the carrier element to the bottom side of the cover panel by applying a peripheral foaming around an edge area of the carrier element and the cover panel;

wherein a vertical is selected between the cover panel and the carrier clement such that the emergence area is compressed and clamped to form a seal between the carrier element and the cover panel inwardly of the peripheral foaming.

* * * * *